United States Patent
Lin et al.

(10) Patent No.: US 8,264,244 B2
(45) Date of Patent: Sep. 11, 2012

(54) CAPACITANCE DIFFERENCE DETECTING CIRCUIT AND CAPACITANCE DIFFERENCE DETECTING METHOD

(75) Inventors: Kun-Chih Lin, Hsinchu (TW); Wen-Chi Wu, Tao-Yuan (TW)

(73) Assignee: Ili Technology Corp., Jhubei, Hsinchu County (TW)

( * ) Notice: Subject to any disclaimer, the term of this patent is extended or adjusted under 35 U.S.C. 154(b) by 446 days.

(21) Appl. No.: 12/703,732

(22) Filed: Feb. 10, 2010

(65) Prior Publication Data

US 2011/0115502 A1    May 19, 2011

(30) Foreign Application Priority Data

Nov. 17, 2009   (TW) ............................... 98138950 A

(51) Int. Cl.
*G01R 27/26* (2006.01)
(52) U.S. Cl. ....................... 324/679; 324/658
(58) Field of Classification Search .................. 324/658, 324/679
See application file for complete search history.

(56) References Cited

U.S. PATENT DOCUMENTS

| 4,831,325 A * | 5/1989 | Watson, Jr. ............... 324/678 |
| 2007/0007971 A1* | 1/2007 | Takekawa et al. ........... 324/662 |

FOREIGN PATENT DOCUMENTS

WO    2009090534 A2    7/2009

* cited by examiner

*Primary Examiner* — Vincent Q Nguyen
(74) *Attorney, Agent, or Firm* — Winston Hsu; Scott Margo

(57) ABSTRACT

A capacitance difference detecting circuit includes a control circuit, for generating a control signal according to a first voltage and a second voltage; a first capacitor to be detected; a second capacitor to be detected; a first constant capacitor, having a terminal coupled to the first terminal of the first capacitor to be detected and the first input terminal; a second constant capacitor, having a terminal coupled to the first terminal of the second capacitor to be detected and the second input terminal; a voltage control unit, cooperating with the first capacitor to be detected, the second capacitor to be detected, the first constant capacitor and the second constant capacitor to control the first voltage and the second voltage. The voltage control unit is an adjustable capacitor and a capacitance value of the adjustable capacitor is controlled by the control signal.

4 Claims, 4 Drawing Sheets

CAPACITANCE DIFFERENCE DETECTING CIRCUIT AND CAPACITANCE DIFFERENCE DETECTING METHOD

BACKGROUND OF THE INVENTION

1. Field of the Invention

The present invention relates to a capacitance difference detecting circuit and a capacitance difference detecting method, and particularly relates to a capacitance difference detecting circuit and a capacitance difference detecting method that need not to measure real capacitance value of the capacitor to be detected.

2. Description of the Prior Art

In modern electronic apparatuses, the capacitor type detector, which is always applied to a touch sensing device such as a touch sensing panel, is a well know technology. However, a prior art capacitor type detector may has different problems. For example, if the capacitor type detector is utilized as the touch sensing panel, the adhesion of ITO may cause non equal capacitance. Additionally, an electronic apparatus may have the problem of parasitical capacitance, background capacitance or system distribution, which may cause low yield or high cost to examine product defect. Besides, if the background capacitance is too large but the variance for detected capacitance of the capacitor type detector is too small (for example, the capacitance variation caused by finger touch), it will be hard to determine the variation of the detecting capacitance. High resolution is needed to determine capacitance variation in this case.

FIG. 1 is a circuit diagram illustrating a prior art capacitance difference detecting circuit. In FIG. 1, the capacitance difference detecting circuit 100 utilizes a relaxation oscillator to compute capacitance value. In this case, the capacitors 101 and 103 are repeatedly charged and discharged, and a frequency of the oscillator and the value of current ID1 are utilized to compute the capacitance value of capacitors 101 and 103. The relation thereof can be shown as Equation 1, wherein $F_{OSC}$ indicates an oscillator frequency, $C_{stray}$ indicates capacitance of the capacitor 101, and CS indicates capacitance value of the capacitor 103.

$$Fosc \propto dV \cdot (C_{stray} + C_S)/I_{D1} \quad (1)$$

Since detail concept for such technology is well known by persons skilled in the art, it is omitted for brevity here. Such capacitance detecting method needs an ADC (analog to digital converter, not illustrated here since there are too many kinds of ADCs in this field) to detect. However, the detecting range of the ADC varies corresponding to different parasitical capacitance, background capacitance. Also, the dynamic range and the sensitivity of the ADC vary corresponding to different detecting ranges, such that the yield and production time are affected.

FIG. 2 illustrates another example of a prior art capacitance difference detecting circuit. In the capacitance difference detecting circuit 200 in FIG. 2, the ADC 201 serves to detect voltage. The detected voltage can be shown as Equation (2)

$$V_S = VDD \cdot \frac{C_S}{C_S + C_{Stray}} \quad (2)$$

Cs indicates capacitance value of the capacitor 203, $C_{stray}$ indicates capacitance value of the capacitor 205. Similar with the example shown in FIG. 1, the circuit shown in FIG. 2 also needs a high resolution ADC 201. However, in the example shown in FIG. 2, most resolution bits of the ADC 201 are wasted on $C_{stray}+C_s$, such that the sensitivity and the dynamic range of detecting operation decrease. Besides, in Equation (2), the noise of the system affects Vs, and correspondingly affects the output of the ADC 201.

According to above mentioned description, the real capacitance value are detected in the prior art. Accordingly, error measurement may be caused due to parasitical capacitance, background capacitance or different kinds of noises.

SUMMARY OF THE INVENTION

Therefore, one objective of the present invention is to provide a capacitor detecting circuit and a capacitor detecting method, which can detect capacitance variation without detecting real capacitance values.

One embodiment of the present invention discloses a capacitance difference detecting circuit, which comprises: a control circuit, for generating a control signal according to a first voltage and a second voltage; a first capacitor to be detected; a second capacitor to be detected; a first constant capacitor, having a terminal coupled to the first terminal of the first capacitor to be detected and the first input terminal; a second constant capacitor, having a terminal coupled to the first terminal of the second capacitor to be detected and the second input terminal; a voltage control unit, cooperating with the first capacitor to be detected, the second capacitor to be detected, the first constant capacitor and the second constant capacitor to control the first voltage and the second voltage. The voltage control unit is an adjustable capacitor and a capacitance value of the adjustable capacitor is controlled by the control signal; wherein capacitance values of the voltage control unit, the first capacitor to be detected and the second capacitor to be detected cause the first voltage and the second voltage to be the same.

Another embodiment of the present invention discloses a capacitance difference detecting method, comprising: (a) utilizing a voltage control unit to cooperate with a first capacitor to be detected and a second capacitor to be detected to generate a first voltage and a second voltage; and (b) computing a capacitance difference between the first capacitor to be detected and the second capacitor to be detected according to the first voltage, the second voltage and a parameter of the voltage control unit.

Still another embodiment discloses a capacitance difference detecting circuit, which comprises: a control circuit, for generating a control signal according to a first voltage and a second voltage; a first capacitor to be detected; a second capacitor to be detected; a voltage control unit, for cooperating with the first capacitor to be detected and the second capacitor to be detected, according to the control signal, to generate the first voltage and the second voltage; and a computing device, for computing a capacitance difference between the first capacitor to be detected and the second capacitor to be detected according to the first voltage, the second voltage and a parameter of the voltage control unit.

According to above-mentioned embodiments, capacitance variation can be detected without detecting real capacitance value, and the comparator offset can be ignored. Additionally, differential input can effectively suppress common model disturbance. Also, capacitance difference is not related with power source such that PSRR can be improved. Moreover, the utilization of only one comparator and a simple digital logic controller can save power and has the advantage of high resolution.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
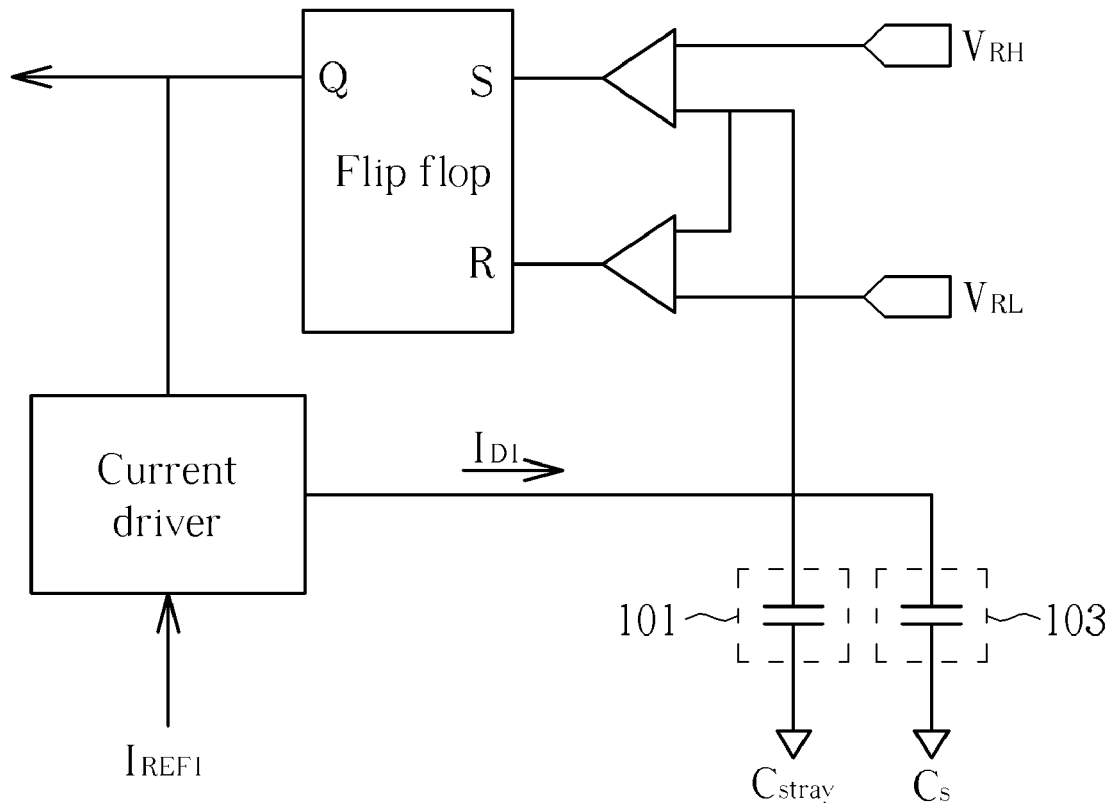
FIGS. 1 and 2 are circuit diagrams illustrating prior art capacitance difference detecting circuits.
Figure 2:
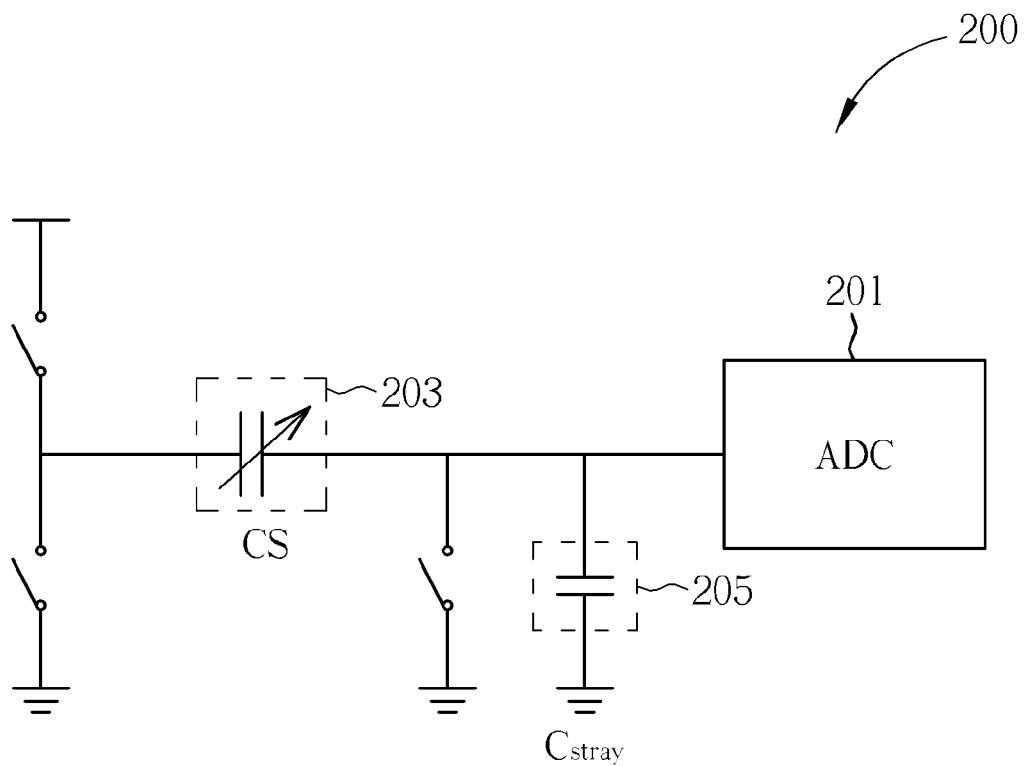
Figure 3:
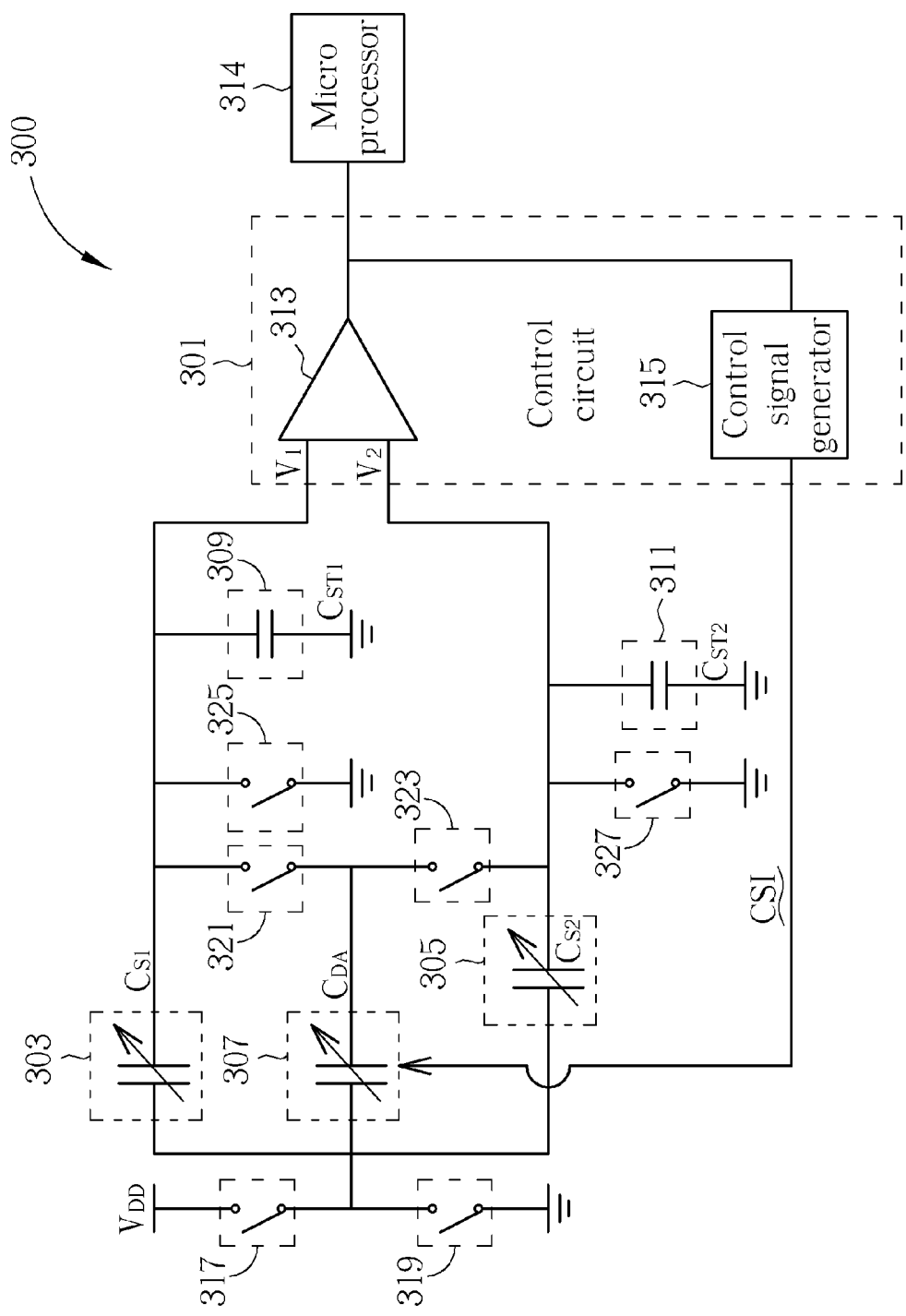
FIG. 3 illustrates a capacitance difference detecting circuit according to one embodiment of the present invention.

FIG. 3 is a schematic diagram illustrating a capacitance difference detecting circuit 300 according to an embodiment of the present application. The capacitance difference detecting circuit 300 comprises a control circuit 301, a first capacitor to be detected 303, a second capacitor to be detected 305, a voltage control unit 307 and constant capacitors 309, 311. The control circuit 301 serves to generate a control signal CSI according to a first voltage $V_1$ and a second voltage $V_2$. The voltage control unit 307 serves to cooperate a first capacitor to be detected 303, a second capacitor to be detected 305, a voltage control unit 307 and the control the constant capacitors 309, 311 to control first voltage $V_1$ and the second voltage $V_2$, according to a control signal CSI. In this embodiment, the voltage control unit 307 can be a variable capacitor or a capacitor matrix, and the control circuit 301 also includes a comparator 313 and a control signal generator 315. The comparator 313 compares the first voltage $V_1$ and the second voltage $V_2$ and outputs a comparison result signal at the output terminal. The control signal generator 315, which can be a digital logic controller, generates the control signal CSI according to the comparison result signal. However, the voltage control unit 307 can be applied by other devices, and the control circuit 301 can include other devices as well. Additionally, the constant capacitors 309, 311 are background capacitors or other constant capacitors that exist in an electronic system, but the constant capacitors 309, 311 can also be the capacitors that are extra-provided capacitors.

Under this structure, the difference value of the first capacitor to be detected 303 and the second capacitor to be detected 305 can be acquired if the first voltage $V_1$ and the second $V_2$ is adjusted to be the same via the control circuit 301, as shown in Equations (3) and (4).

In Equations (3) and (4), $C_{ST}$ indicates background capacitance value, $C_{S1}$ indicates the capacitance value of the first capacitor to be detected 303, $C_{S2}$ indicates the second capacitor to be detected 305, $C_{df}$ indicates an average for a difference value of the first capacitor to be detected 303 and the second capacitor to be detected 305, $C_{DA}$ indicates the capacitance value of the voltage control unit 307, $C_{ST1}$ indicates a value of the capacitor 309, and $C_{ST2}$ indicates a value of the capacitor 311. As shown in following equations, $C_{df}$ can be computed according to $C_S, C_{S1}, C_{S2}, C_{ST1}, C_{ST2}$, Cdf and $C_{DA}$ as shown in Equation (3), when a difference between the first voltage $V_1$ and the second voltage $V_2$ is set to be 0. Besides, if the first capacitor to be detected 303 and the second capacitor to be detected 305 vary due to system noise or other reasons, the capacitance difference between the first capacitor to be detected 303 and the second capacitor to be detected 305 2(Cdf2−Cdf1) can be computed according to $C_{ST1}, C_{ST2}, C_{DA1}$ and $C_{DA2}$.

Let $$C_{S1} = C_S + C_{df},$$
$$C_{S2} = C_S - C_{df},$$
$$C_{S1} - C_{S2} = 2 \cdot C_{df}$$
$$Vdiff = V1 - V2$$
$$Vdiff = VDD \cdot \left( \frac{C_S + C_{df}}{C_S + C_{df} + C_{ST1}} - \frac{C_S - C_{df} + C_{DA}}{C_S - C_{df} + C_{DA} + C_{ST2}} \right)$$
$$= 0$$

$$\Rightarrow C_{df} = \left( \frac{C_{ST1}}{C_{ST1} + C_{ST2}} \cdot C_{DA} + C_S \cdot \frac{C_{ST1} - C_{ST2}}{C_{ST1} + C_{ST2}} \right) \quad (3)$$

$$\Delta C = 2 \cdot (C_{df2} - C_{df1}) = 2 \cdot \frac{C_{ST1}}{C_{ST1} + C_{ST2}} \cdot (C_{DA2} - C_{DA1}) \quad (4)$$

In above-mentioned embodiments, $C_{ST1}, C_{ST2}$ are parasitical capacitance values in the system and are fixed when the system is manufactured and can be considered as constant values. The variation of $C_{DA}$ is not related with the background capacitance Cs, and no resolution bit is needed to indicate Cs. Additionally, sensitivity of the detector can be well improved. Small capacitance variation can be detected if $C_{DA}$ is small enough. Besides, offset of the comparator will be transformed to a difference value of $C_{S1}$ and $C_{S2}$. In this case, the offset will be removed when two capacitance variation are subtracted, such that error detection of the detector can be avoided. In this structure, the comparator offset can be ignored, thus circuit design complexity can be decreased and ADC linearity can be improved. Furthermore, it can be proved by Equation (3) that the capacitance variation is not related the system voltage $V_{DD}$/therefore PSRR (Power Supply Rejection Ratio) can be increased to improve noise rejection ability. Additionally, in above-mentioned structure, differential input can be utilized to restrain common model noise, to improve noise rejection of the detector and to increase SNR (Signal Noise Ratio) thereof. It should be noted the scope of the present invention is not limited to the operation of Equations (3) and (4), $C_{df}$ can also be acquired if the first voltage V1 and the second voltage V2 are designed to have a difference value beside 0.

The capacitance difference detecting circuit 300 can include switches 317, 319, 321, 323, 325 and 327 besides above-mentioned devices, and control charging and discharging of the switches 317, 319, 321, 323, 325 and 327. AC in Equation (4) can be acquired via a computing device such as a microprocessor.

Figure 4:
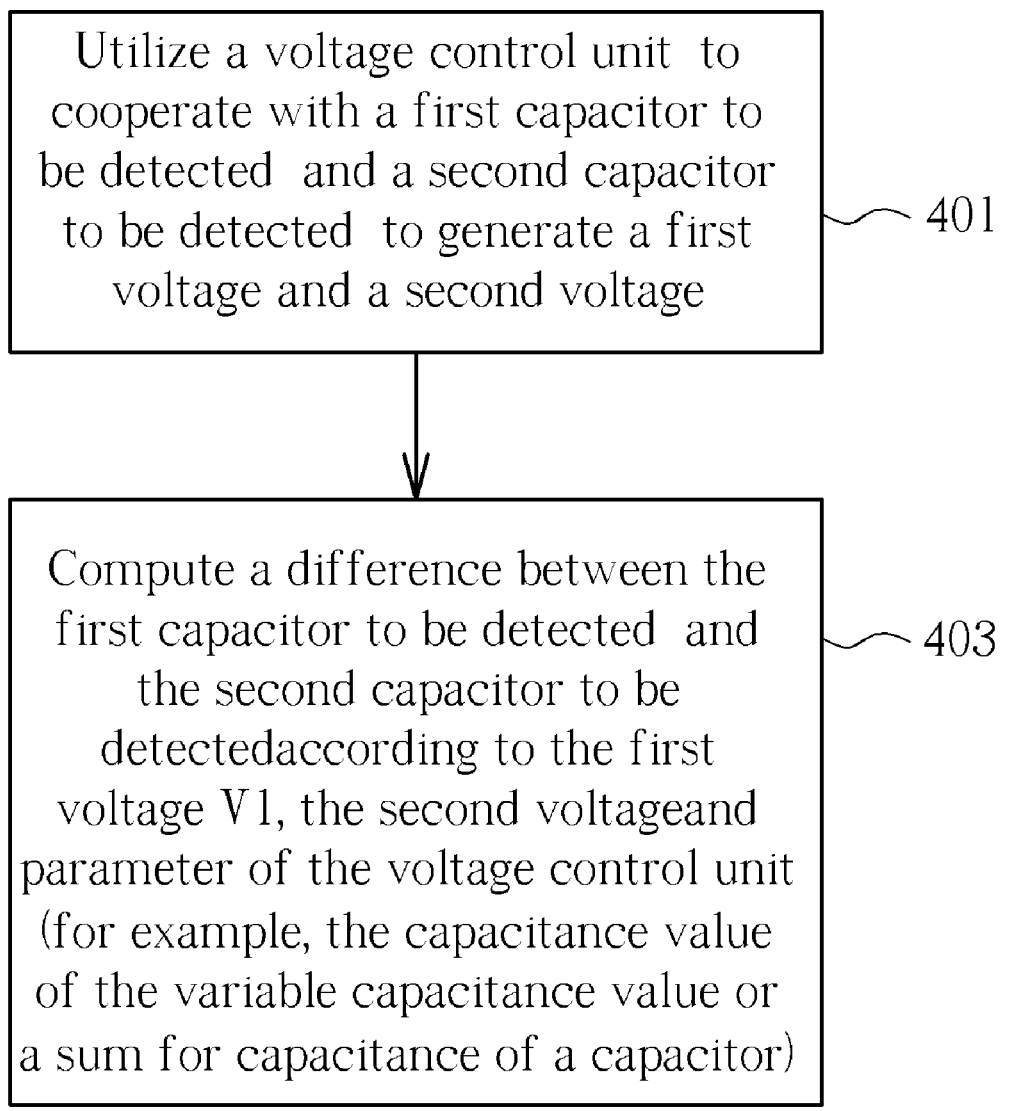
FIG. 4 illustrates a capacitance detecting method according to one embodiment of the present invention.

FIG. 4 is a flow chart illustrating a capacitance detecting method according to an embodiment of the present invention. As shown in FIG. 4, the capacitance detecting method according to one embodiment of the present invention includes:

Step 401

Utilize a voltage control unit (307) to cooperate with a first capacitor to be detected (303) and a second capacitor to be detected (305) to generate a first voltage $V_1$ and a second voltage $V_2$.

Step 403

Compute a difference between the first capacitor to be detected (303) and the second capacitor to be detected (305) according to the first voltage V1, the second voltage V2 and parameter of the voltage control unit (for example, the capacitance value of the variable capacitance value or a sum for capacitance of a capacitor).

If the circuit including the detected capacitance comprises a first constant capacitor and a second constant capacitor (ex. $C_{ST1}$ and $C_{ST2}$), step 403 can compute the difference between the first capacitor to be detected (303) and the second capacitor to be detected (305). One of the embodiments is computing according to above-mentioned Equations (3) and (4). Other detail technology characteristics are disclosed in above-mentioned embodiments, thus it is omitted for brevity.

According to above-mentioned embodiments, capacitance variation can be detected without detecting real capacitance value, and the comparator offset can be ignored. Additionally, differential input can effectively suppress common model disturbance. Also, capacitance difference is not related with power source such that PSRR can be improved. Moreover, the utilization of only one comparator and a simple digital logic controller can save power and has the advantage of high resolution.

Those skilled in the art will readily observe that numerous modifications and alterations of the device and method may be made while retaining the teachings of the invention.

What is claimed is:

1. A capacitance difference detecting circuit, comprising:
   a control circuit, for generating a control signal according to a first voltage and a second voltage;
   a first capacitor to be detected;
   a second capacitor to be detected;
   a first constant capacitor, having a terminal coupled to the first terminal of the first capacitor to be detected and the first input terminal;
   a second constant capacitor, having a terminal coupled to the first terminal of the second capacitor to be detected and the second input terminal;
   a voltage control unit, cooperating with the first capacitor to be detected, the second capacitor to be detected, the first constant capacitor and the second constant capacitor to control the first voltage and the second voltage;
   wherein the voltage control unit is an adjustable capacitor and a capacitance value of the adjustable capacitor is controlled by the control signal; wherein capacitance values of the voltage control unit, the first capacitor to be detected and the second capacitor to be detected cause the first voltage and the second voltage to be the same.

2. The capacitance difference detecting circuit of claim 1, wherein the control circuit comprises:
   a comparator, comprising a first input terminal, a second input terminal and an output terminal, wherein the comparator compares the first voltage at the first input terminal and the second voltage at the second input terminal to output a comparison result signal at the output terminal;
   a control signal generator, for generating the control signal according to the comparison result signal;
   wherein the first capacitor to be detected includes a first terminal coupled to a predetermined voltage and a second terminal coupled to the first input terminal;
   where the second capacitor to be detected includes a third terminal coupled to the predetermined voltage and a fourth terminal coupled to the second input terminal.

3. The capacitance difference detecting circuit of claim 2, wherein the control signal generator is a digital logic controller.

4. The capacitance difference detecting circuit of claim 1, wherein the first constant capacitor and the second constant capacitor are parasitic capacitors.

* * * * *